(12) United States Patent
Hamamoto et al.

(10) Patent No.: US 8,569,429 B2
(45) Date of Patent: Oct. 29, 2013

(54) CURABLE SILICONE RESIN COMPOSITION WITH HIGH RELIABILITY AND OPTICAL SEMICONDUCTOR DEVICE USING SAME

(71) Applicant: Shin-Etsu Chemical Co., Ltd., Chiyoda-ku (JP)

(72) Inventors: Yoshihira Hamamoto, Takasaki (JP); Tsutomu Kashiwagi, Annaka (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 0 days.

(21) Appl. No.: 13/681,882

(22) Filed: Nov. 20, 2012

(65) Prior Publication Data

US 2013/0161683 A1 Jun. 27, 2013

(30) Foreign Application Priority Data

Dec. 22, 2011 (JP) .................. 2011-281844

(51) Int. Cl.
*C08L 83/07* (2006.01)
(52) U.S. Cl.
USPC ............. 525/477; 524/588; 525/478; 528/15; 528/31; 528/32; 528/43
(58) Field of Classification Search
None
See application file for complete search history.

(56) References Cited

U.S. PATENT DOCUMENTS

| | | | | |
|---|---|---|---|---|
| 5,348,931 A | * | 9/1994 | Mochizuki et al. | 503/227 |
| 6,258,506 B1 | * | 7/2001 | Harkness et al. | 430/198 |
| 7,807,736 B2 | * | 10/2010 | Kashiwagi et al. | 524/101 |
| 7,863,392 B2 | * | 1/2011 | Nakanishi et al. | 525/478 |
| 2010/0146886 A1 | * | 6/2010 | Zhu et al. | 52/232 |
| 2010/0276721 A1 | | 11/2010 | Yoshitake et al. | |
| 2011/0160410 A1 | | 6/2011 | Sagawa et al. | |
| 2011/0251356 A1 | * | 10/2011 | Sagawa et al. | 525/478 |

FOREIGN PATENT DOCUMENTS

| | | |
|---|---|---|
| JP | 2009-527622 | 7/2009 |
| JP | 2010-1335 | 1/2010 |

* cited by examiner

*Primary Examiner* — Marc Zimmer
(74) *Attorney, Agent, or Firm* — Oblon, Spivak, McClelland, Maier & Neustadt, L.L.P.

(57) ABSTRACT

An optical semiconductor device that combines low gas permeability and high reliability. A curable silicone resin composition comprising: (A) an alkenyl group-containing organopolysiloxane comprising an organopolysiloxane represented by an average composition formula (1) and containing at least two alkenyl groups per molecule:

$$(R^1SiO_{3/2})_a(R^2{}_2SiO)_b(R^3R^4{}_2SiO_{1/2})_c \quad (1)$$

wherein $R^1$ represents an alkyl group, $R^2$ represents an aryl group, $R^3$ represents an alkenyl group, and $R^4$ represents an alkyl group or an aryl group, (B) an organohydrogenpolysiloxane represented by an average composition formula (2) and containing at least two silicon atom-bonded hydrogen atoms per molecule:

$$R^1{}_dR^2{}_eH_fSiO_{(4-d-e-f)/2} \quad (2)$$

wherein $R^1$ and $R^2$ are as defined above, and (C) an addition reaction catalyst.

9 Claims, No Drawings

CURABLE SILICONE RESIN COMPOSITION WITH HIGH RELIABILITY AND OPTICAL SEMICONDUCTOR DEVICE USING SAME

BACKGROUND OF THE INVENTION

1. Field of the Invention

The present invention relates to a silicone resin composition that is useful as an encapsulating material for an optical semiconductor element, and an optical semiconductor device that uses the composition.

2. Description of the Prior Art

Recently, high-brightness LEDs that exhibit strong light intensity and generate a large amount of heat have become commercially available, and are now being widely used, not only as the BLU units within liquid crystal televisions and mobile phones, but also for general illumination. JP 2010-1335 A (Patent Document 1) discloses that by adding an epoxy-containing silicone to a phenyl-containing silicone resin to improve the adhesiveness, an encapsulating material having excellent heat resistance, light-resistant stability and weather resistance can be provided. Further, JP 2009-527622 A (Patent Document 2) discloses a silicone resin composition comprising a phenyl-containing resin and a linear phenyl-containing hydrogenoligoorganosiloxane which is useful for extending the life of an LED.

In an LED package, a structure known as a lead frame which is prepared by silver-plating a copper sheet is used. However, it is known that if an LED that has been encapsulated with a silicone is left to stand under conditions in which a sulfur content is generated, then if the gas permeability of the silicone is high, discoloration tends to occur at the silver surface, and silver sulfide is formed resulting in a blackening of the surface. Because it is known that blackening of the lead frame causes a reduction in the brightness of the LED, it is desirable that the encapsulating resin exhibits low gas permeability. However, although the silicone resins described above exhibit excellent light resistance, heat discoloration resistance and impact resistance, in the case of the resin of Patent Document 1, the epoxy groups exhibit poor heat resistance and light resistance, and therefore the resin tends to suffer from discoloration under high temperature or high-intensity light. Further, in combinations of a phenyl-containing resin and a linear phenyl-containing hydrogenoligoorganosiloxane such as that disclosed in Patent Document 2, the heat resistance and light resistance are inferior to those of a methyl-containing silicone resin, and improving the reliability has proven difficult.

Patent Document 1: JP 2010-001335 A
Patent Document 2: JP 2009-527622 A

SUMMARY OF THE INVENTION

Accordingly an object of the present invention is to provide a curable silicone resin composition that has excellent reliability such as heat resistance and light resistance, exhibits low gas permeability, and is ideal for encapsulating optical semiconductor elements, and also to provide a highly reliable optical semiconductor device that is highly resistant to heat and light degradation.

As a result of various investigations aimed at achieving the above object, the inventors of the present invention discovered that in silicone resins using a resin having $(R^2SiO_{3/2})$ units (wherein $R^2$ represents an aryl group), the $R^2$ groups yield structures that are extremely susceptible to heat and light degradation. However, they also discovered that by using a resin having $(R^1SiO_{3/2})$ units (wherein $R^1$ represents an alkyl group), and also having $(R^2_2SiO)$ units (wherein $R^2$ represents an aryl group) within the resin, the heat resistance and light resistance and the like improved, and a silicone resin composition having low gas permeability could be obtained.

Moreover, the inventors also discovered that by encapsulating an optical semiconductor element (such as a high-brightness LED) with a cured product of the above silicone resin composition, an optical semiconductor device having excellent durability such as resistance to discoloration and impact resistance could be provided.

In other words, a first aspect of the present invention provides a curable silicone resin composition comprising:
(A) an alkenyl group-containing organopolysiloxane comprising an organopolysiloxane
(A1) represented by an average composition formula (1) shown below and containing at least two alkenyl groups per molecule:

$$(R^1SiO_{3/2})_a(R^2_2SiO)_b(R^3R^4_2SiO_{1/2})_c \quad (1)$$

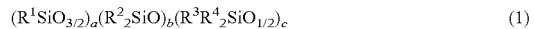

wherein
$R^1$ represents an alkyl group of 1 to 10 carbon atoms,
$R^2$ represents an aryl group of 6 to 14 carbon atoms,
$R^3$ represents an alkenyl group of 2 to 8 carbon atoms,
each $R^4$ independently represents an alkyl group of 1 to 10 carbon atoms or an aryl group of 6 to 14 carbon atoms,
a represents a number of 0.2 to 0.6, b represents a number of 0.2 to 0.6, and c represents a number of 0.05 to 0.5, provided that a+b+c=1.0,
(B) an organohydrogenpolysiloxane represented by an average composition formula (2) shown below and containing at least two silicon atom-bonded hydrogen atoms per molecule: in an amount that yields a molar ratio of silicon atom-bonded hydrogen atoms within the component (B) relative to alkenyl groups bonded to silicon atoms that exist within the composition of 0.4 to 4.0:

$$R^1_d R^2_e H_f SiO_{(4-d-e-f)/2} \quad (2)$$

wherein $R^1$ and $R^2$ are the same as defined above, d represents a number of 0.6 to 1.5, e represents a number of 0 to 0.5, and f represents a number of 0.4 to 1.0, provided that d+e+f=1.0 to 2.5, and
(C) a catalytically effective amount of an addition reaction catalyst.

A second aspect of the present invention provides an optical semiconductor device having an encapsulated optical semiconductor element, the device comprising an optical semiconductor element, and a cured product of the above silicone resin composition that encapsulates the active region of the element.

The silicone resin composition of the present invention exhibits a high degree of reliability, with superior heat resistance and light resistance, and also has low gas permeability. An optical semiconductor device of the present invention that uses this composition as an encapsulating agent exhibits excellent durability such as resistance to discoloration and impact resistance.

EMBODIMENTS OF THE INVENTION

A more detailed description of the present invention is presented below.

<Silicone Resin Composition>
(A) AlkenylGroup-Containing Organopolysiloxane
(A1) Organopolysiloxane:

The silicone resin (A) used in the present invention comprises, as an essential component, anorganopolysiloxane (A1) represented by the average composition formula (1) shown below and containing at least two alkenyl groups per molecule.

$$(R^1SiO_{3/2})_a(R^2_2SiO)_b(R^3R^4_2SiO_{1/2})_c \quad (1)$$

In this formula:
$R^1$ represents an alkyl group of 1 to 10 carbon atoms,
$R^2$ represents an aryl group of 6 to 14 carbon atoms,
$R^3$ represents an alkenyl group of 2 to 8 carbon atoms,
each $R^4$ independently represents an alkyl group of 1 to 10 carbon atoms or an aryl group of 6 to 14 carbon atoms,
a represents a number of 0.2 to 0.6, b represents a number of 0.2 to 0.6, and c represents a number of 0.05 to 0.5, provided that a+b+c=1.0.

In the above formula (1), $R^1$ represents an alkyl group of 1 to 10 carbon atoms, and specific examples include a methyl group, ethyl group, propyl group, isopropyl group, butyl group, isobutyl group, tert-butyl group, pentyl group, neopentyl group, hexyl group, octyl group, nonyl group and decyl group. A methyl group is preferred.

$R^2$ represents an aryl group of 6 to 14 carbon atoms, and specific examples of such $R^2$ groups include aryl groups such as a phenyl group, tolyl group, xylyl group and naphthyl group. A phenyl group is preferred.

In formula (1), $R^3$ represents an alkenyl group of 2 to 8 carbon atoms, and preferably 2 to 6 carbon atoms. Specific examples of such $R^3$ groups include a vinyl group, allyl group, propenyl group, isopropenyl group, butenyl group, hexenyl group, cyclohexenyl group and octenyl group, and of these, a vinyl group or allyl group is preferred.

In formula (1), $R^4$ represents an alkyl group of 1 to 10 carbon atoms or an aryl group of 6 to 14 carbon atoms, and specific examples of these groups include the same groups as those mentioned above for $R^1$ and $R^2$.

The number of alkenyl groups incorporated within a single molecule of the organopolysiloxane represented by formula (1) is at least two, and the alkenyl group content within the organopolysiloxane is preferably within a range from 0.001 to 1 mol/100 g, and particularly from 0.005 to 0.5 mol/100 g.

Further, a represents a positive number of 0.2 to 0.6, and preferably 0.3 to 0.6, b represents a positive number of 0.2 to 0.6, and preferably 0.3 to 0.6, and c represents a positive number of 0.05 to 0.5, and preferably 0.05 to 0.3, provided that a+b+c=1.0.

In the present invention, the alkenyl group-containing organopolysiloxane of the component (A) may include one or more other alkenyl group-containing organopolysiloxanes in addition to the component (A1) described above, and a representative example of this other alkenyl group-containing organopolysiloxane is analkenyl group-containing linear organopolysiloxane (A2) described below.

(A2) Alkenyl group-containing linear organopolysiloxane:
The organopolysiloxane of the component (A2) is typically an organopolysiloxane having a linear structure in which the main chain is composed of repeating diorganosiloxane units (($R'$)$_2$SiO$_{2/2}$ units), and both molecular chain terminals are blocked with triorganosiloxy groups (($R'$)$_3$SiO$_{1/2}$ units). This organopolysiloxane may also include a small amount of branched structures (namely, trifunctional-siloxane units) within the molecular chain.

In the above formulas, each $R'$ independently represents a monovalent hydrocarbon group containing 1 to 10 carbon atoms, and preferably 1 to 3 carbon atoms. Specific examples of $R'$ include alkyl groups such as a methyl group, ethyl group, propyl group, isopropyl group, butyl group, isobutyl group, tert-butyl group, pentyl group, neopentyl group and hexyl group, cycloalkyl groups such as a cyclohexyl group, alkenyl groups such as a vinyl group, allyl group and propenyl group, aryl groups such as a phenyl group, tolyl group and xylyl group, and aralkyl groups such as a benzyl group, phenylethyl group and phenylpropyl group.

Of the various possibilities, a linear organopolysiloxane represented by general formula (3) shown below, having at least one vinyl group bonded to the silicon atom at each of the molecular chain terminals, is preferred. From the viewpoints of workability and curability and the like, the linear organopolysiloxane has a viscosity at 25° C. that is preferably within a range from 10 to 1,000,000 mPa·s, and more preferably from 1,000 to 50,000 mPa·s. The viscosity can be measured, for example, using a rotational viscometer or the like.

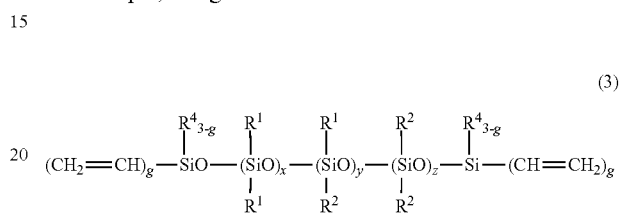

In the above formula, $R^1$, $R^2$ and $R^4$ are the same as defined above, g represents an integer of 1, 2 or 3, and each of x, y and z represents 0 or a positive integer, provided that 1≤x+y+z≤1,000, and at least one of x and y is an integer of 1 or greater.

In the above formula (3), each of x, y and z represents 0 or a positive integer, provided that 1≤x+y+z≤1,000, preferably that 5≤x+y+z≤500, and more preferably that 30≤x+y+z≤500. However, it is also preferable that 0.5<(x+y)/(x+y+z)≤1.0.

Specific examples of this type of organopolysiloxane represented by formula (3) include the compounds shown below.

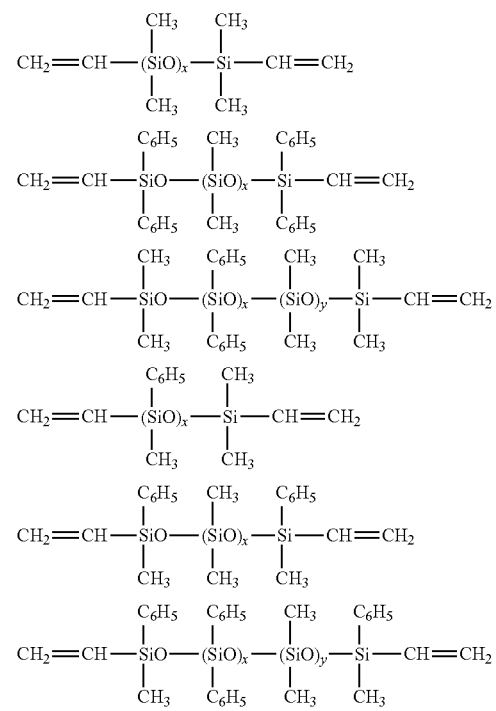

In the above formulas, x and y are the same as defined above.

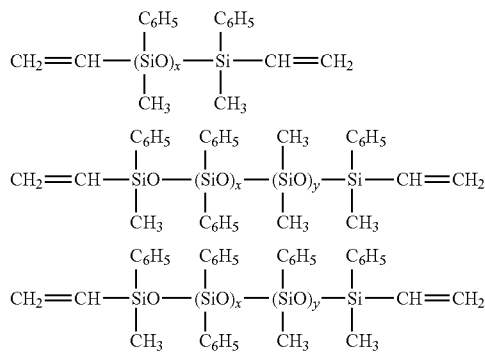

In the above formulas, x and y are the same as defined above.

By using the component (A2), the distance between crosslinking points can be lengthened, and therefore appropriate adjustment of the amount added of the component (A2) offers the advantage of imparting the cured product with flexibility while maintaining an appropriate degree of hardness. However, if the amount of the component (A2) is too large, then the surface of the cured product tends to develop tack, and the gas permeability also tends to increase, which can cause a deterioration in the LED brightness, and therefore the amount added of the component (A2) is preferably within a range from 0.01 to 50 parts by mass, and more preferably from 1 to 30 parts by mass, per 100 parts by mass of the component (A1).

In the resin structure organopolysiloxane (A1), if the number of $(R^1SiO_{3/2})$ units is represented by a, the number of $(R^2{}_2SiO)$ units is represented by b, and the number of $(R^3R^4{}_2SiO_{1/2})$ units is represented by c, then it is preferable that $0.01 \leq \{(b+c)/a\} \leq 2$, more preferable that $0.1 \leq \{(b+c)/a\} \leq 1.2$, and still more preferable that $0.1 \leq \{(b+c)/a\} \leq 1.0$. Further, the polystyrene-equivalent weight-average molecular weight of the organopolysiloxane (A1), determined by GPC, is preferably within a range from 500 to 10,000, and more preferably from 1,000 to 4,000.

The resin structure organopolysiloxane (A1) can be synthesized easily, for example by combining compounds that function as unit sources for the above three types of siloxane units (namely the units to which the subscripts a, b and c are appended) in amounts that satisfy the molar ratio described above, and then performing a co-hydrolysis reaction in the presence of an acid. Further, the aforementioned linear organopolysiloxane (A2) can also be synthesized in a similar manner using compounds that function as units sources for the constituent units.

Examples of compounds that may be used as the a-unit source include n-propyltrichlorosilane, methyltrichlorosilane, methyltrimethoxysilane and methyltriethoxysilane.

Examples of compounds that may be used as the b-unit source include dichlorodiphenylsilane and dimethoxydiphenylsilane.

Examples of compounds that may be used as the c-unit source include the compounds shown below.

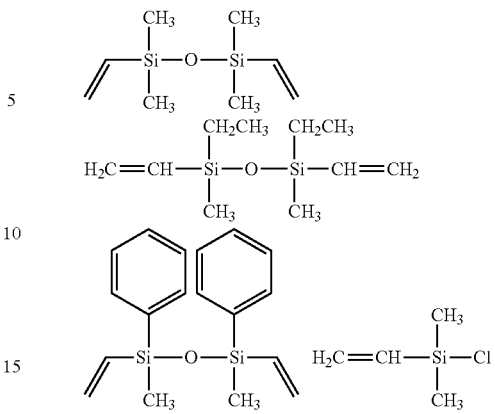

(B) Organohydrogenpolysiloxane

The organohydrogenpolysiloxane of the component (B) used in the present invention functions as a crosslinking agent, and forms a cured product via an addition reaction between the hydrogen atoms bonded to silicon atoms (hereafter also referred to as SiH groups) within the component (B) and the alkenyl groups within the component (A). The organohydrogenpolysiloxane is represented by an average composition formula (2) shown below, and contains at least two silicon atom-bonded hydrogen atoms per molecule.

$$R^1{}_d R^2{}_e H_f SiO_{(4-d-e-f)/2} \qquad (2)$$

In this formula, $R^1$ and $R^2$ are the same as defined above, d represents a number of 0.6 to 1.5, e represents a number of 0 to 0.5, and f represents a number of 0.4 to 1.0, provided that d+e+f=1.0 to 2.5.

In the above formula (2), $R^1$ and $R^2$ are the same as defined above, but $R^1$ is preferably an alkyl group of 1 to 10 carbon atoms, and particularly a lower alkyl group of 1 to 3 carbon atoms such as a methyl group. $R^2$ is preferably a phenyl group. Further, d represents a number of 0.6 to 1.5, and preferably 0.6 to 1.4, e represents a number of 0 to 0.5, and preferably 0 to 0.4, and f represents a positive number of 0.4 to 1.0, and preferably 0.4 to 0.8, provided that d+e+f=1.0 to 2.5, and preferably d+e+f=1.5 to 2.4. There are no particular limitations on the positions of the SiH groups within the molecule, and the SiH groups may be bonded to either the molecular chain terminals or to non-terminal positions within the molecular chain.

The organohydrogenpolysiloxane of the component (B) preferably contains at least 20% by mass, namely 20 to 100% by mass, and particularly 30 to 90% by mass, of a linear organohydrogenpolysiloxane which has one SiH group at each of the two terminals and may include some partial branching. Examples of this linear organohydrogenpolysiloxane include compounds represented by general formula (4) shown below.

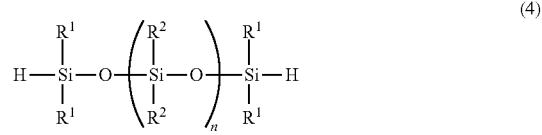

In the above formula, $R^1$ and $R^2$ are the same as defined above, and n represents an integer of 1 or greater, preferably 1 to 50, and more preferably 1 to 10.

In formula (4), R² is the same as defined above, and specific examples include the same groups as those mentioned above for R².

Examples of organohydrogenpolysiloxanes other than the organohydrogenpolysiloxanes represented by the above formula (4) include compounds having at least three, preferably 3 to 10, and more preferably 3 to 6, SiH groups per molecule, and branched organohydrogenpolysiloxanes can be used particularly favorably. There are no particular limitations on the positions of the SiH groups within these molecules, and the SiH groups may be bonded to either the molecular chain terminals or to non-terminal positions within the molecular chain.

As described above, a linear organohydrogenpolysiloxane is preferred, and a compound represented by general formula (4) is particularly desirable, but an aforementioned organohydrogenpolysiloxane having at least three SiH groups per molecule, and preferably a branched organohydrogenpolysiloxane, may be added as desired, and if added, the amount of this organohydrogenpolysiloxane having at least three SiH groups typically represents not more than 80% by mass, and preferably 0 to 80% by mass, of the organohydrogenpolysiloxane of the component (B).

Specific examples of branched organohydrogenpolysiloxanes having at least three SiH groups per molecule include tris(dimethylhydrogensiloxy)methylsilane, tris(dimethylhydrogensiloxy)phenylsilane, 1,1,3,3-tetramethyldisiloxane, 1,3,5,7-tetramethylcyclotetrasiloxane, methylhydrogenpolysiloxane with both terminals blocked with trimethylsiloxy groups, copolymers of dimethylsiloxane and methylhydrogensiloxane with both terminals blocked with trimethylsiloxy groups, copolymers of dimethylsiloxane and methylhydrogensiloxane with both terminals blocked with dimethylhydrogensiloxy groups, copolymers of methylhydrogensiloxane and diphenylsiloxane with both terminals blocked with trimethylsiloxy groups, copolymers of methylhydrogensiloxane, diphenylsiloxane and dimethylsiloxane with both terminals blocked with trimethylsiloxy groups, copolymers composed of $(CH_3)_2HSiO_{1/2}$ units and $SiO_{4/2}$ units, and copolymers composed of $(CH_3)_2HSiO_{1/2}$ units, $SiO_{4/2}$ units and $(C_6H_5)SiO_{3/2}$ units.

Further, organohydrogenpolysiloxanes represented by the structural formulas shown below can also be used.

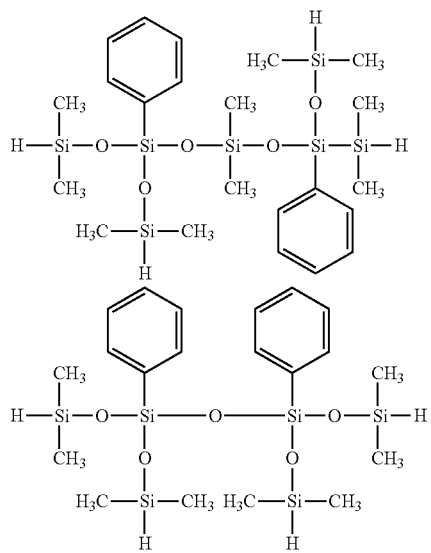

-continued

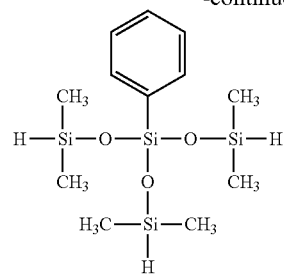

The molecular structure of the non-linear organohydrogenpolysiloxane may be cyclic, branched or a three dimensional network structure, but the number of silicon atoms within a single molecule (or the polymerization degree) is typically within a range from 3 to 100, and preferably from 3 to 10.

This type of organohydrogenpolysiloxane can be prepared using conventional methods, and is normally obtained either by hydrolysis of a chlorosilane such as $R^5SiHCl_2$, $(R^5)_3SiCl$, $(R^5)_2SiCl_2$ or $(R^5)_2SiHCl$ (wherein $R^5$ represents a monovalent hydrocarbon group that contains no aliphatic unsaturated bonds and preferably contains 1 to 6 carbon atoms, and specific examples of $R^5$ include alkyl groups such as a methyl group, ethyl group, propyl group, isopropyl group, butyl group, isobutyl group, tert-butyl group, pentyl group, neopentyl group, hexyl group, octyl group, nonyl group and decyl group, aryl groups such as a phenyl group, tolyl group, xylyl group and naphthyl group, and aralkyl groups such as a benzyl group, phenylethyl group and phenylpropyl group, and $R^5$ is preferably an aryl group), or by performing an equilibration of the siloxane obtained upon hydrolysis using a strong acid catalyst.

The organohydrogenpolysiloxane of the component (B) preferably has an SiH group content of 0.30 to 1.50 mol/100 g.

The amount added of the organohydrogenpolysiloxane of the component (B) must be effective in curing the composition of the present invention by a hydrosilylation reaction with the aforementioned component (A). Specifically, the amount used of the component (B) is determined so that the molar ratio of silicon atom-bonded hydrogen atoms (SiH groups) within the component (B) relative to all the alkenyl groups bonded to silicon atoms that exist within the composition is within a range from 0.5 to 4.0, preferably from 0.8 to 2.0, and more preferably from 0.9 to 1.5. If this molar ratio is too low, then the curing reaction proceeds poorly, whereas if the molar ratio is too high, a large amount of unreacted SiH groups remains within the cured product, which can cause changes in the physical properties of the obtained cured product over time.

The above expression "all the alkenyl groups bonded to silicon atoms that exist within the composition" includes not only the alkenyl groups of the component (A), and for example in those cases where a compound containing an alkenyl group is used as a adhesion promoter of an optional component (D) described below, also includes the silicon atom-bonded alkenyl group(s) within this compound. Of all the alkenyl groups bonded to silicon atoms that exist within the composition, the proportion of alkenyl groups from the component (A) is preferably at least 80 mol %, more preferably at least 85 mol %, and even more preferably 90 mol % or higher. If the proportion of alkenyl groups from the component (A) is too low, then the properties of the adhesion promoter become overly significant, and the reliability tends to deteriorate.

From the viewpoint of achieving a favorable balance between the gas permeability, the heat resistance and the light resistance, the aryl group content among all the components within the composition of the present invention is preferably within a range from 20 to 50% by mass, and more preferably from 25 to 50% by mass, relative to the combined mass of the component (A) and the component (B). If this aryl group content is too low, then the gas permeability increases, whereas if the aryl group content is too high, the heat resistance and light resistance may deteriorate. Here, the expression "the aryl group content among all the components within the composition of the present invention" includes not only the aryl groups within the component (A) and the component (B), but also aryl groups within other components. For example, if a compound containing an aryl group is used as the adhesion promoter of the optional component (D) described below, then the aryl group within this compound is also included in the aryl group content.

(C) Addition Reaction Catalyst

The addition reaction catalyst of the component (C) is added to promote the addition reaction between the alkenyl groups within the component (A) and the SiH groups within the component (B), and the types of catalysts well known to those skilled in the field can be used. Platinum group metal-based catalysts such as platinum-based, palladium-based and rhodium-based catalysts can be used, but from the viewpoint of cost and the like, platinum-based catalysts are preferred. Examples of appropriate platinum-based catalysts include $H_2PtCl_6 \cdot mH_2O$, $K_2PtCl_6$, $KHPtCl_6 \cdot mH_2O$, $K_2PtCl_4$, $K_2PtCl_4 \cdot mH_2O$ and $PtO_2 \cdot mH_2O$ (wherein m represents a positive integer). Further, complexes of the above platinum-based catalysts with hydrocarbons such as olefins, alcohols, or vinyl group-containing organopolysiloxanes can also be used. A single catalyst may be used alone, or a combination of two or more different catalysts may be used.

The addition reaction catalyst need only be added in a so-called catalytic amount (namely, an amount that is effective as a catalyst), and the catalyst is preferably used in an amount that provides an equivalent mass of the platinum group metal of 0.0001 to 0.5 parts by mass, and more preferably 0.0001 to 0.05 parts by mass, relative to 100 parts by mass of the combination of the component (A) and the component (B).

—Other Optional Components—

Where necessary, the silicone resin composition of the present invention may also include various conventional additives besides the components (A) to (C) described above, provided the inclusion of these additives does not impair the objects and effects of the present invention.

(D) Adhesion Promoter:

The adhesion promoter has a function of improving the adhesion of the composition of the present invention to an adherend, or in the case of encapsulation of an optical semiconductor element, improving the adhesion to the element. Specific examples of the adhesion promoter include silane coupling agents such as vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, 3-methacryloyloxypropylmethyldimethoxysilane, 3-methacryloyloxypropyltrimethoxysilane, 3-methacryloyloxypropylmethyldiethoxysilane, 3-methacryloyloxypropyltriethoxysilane, N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, N-phenyl-3-aminopropyltrimethoxysilane and 3-mercaptopropyltrimethoxysilane, as well as trimethoxysilane, tetramethoxysilane, and oligomers thereof.

Additional examples include organosilicon compounds containing one or more groups selected from among a vinyl group, an epoxy group, a silicon atom-bonded alkoxy group and a silicon atom-bonded hydroxyl group within a single molecule, as represented by formulas shown below.

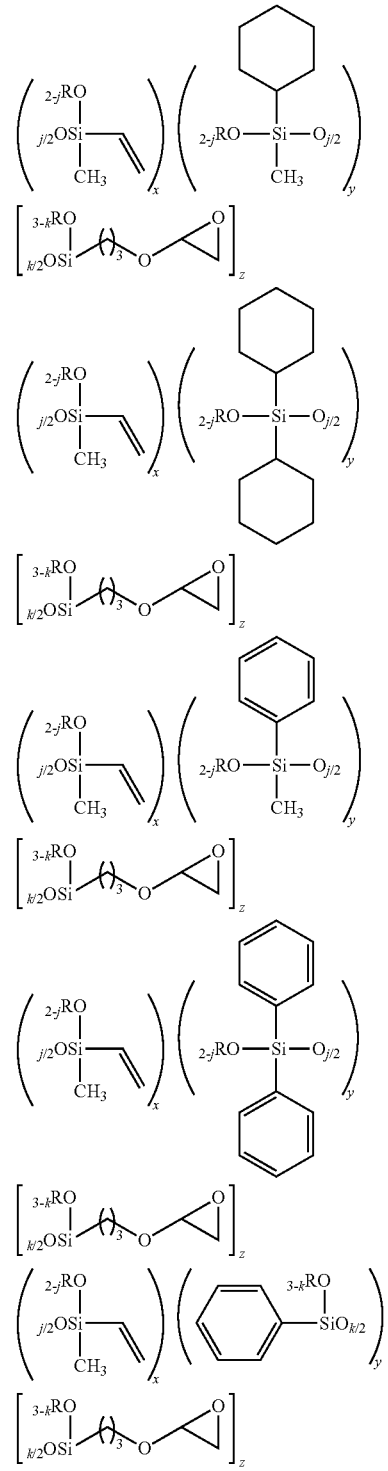

-continued
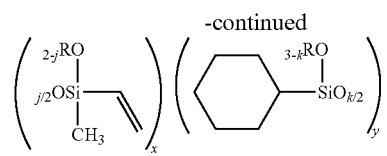
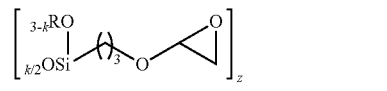
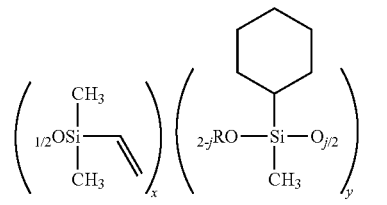
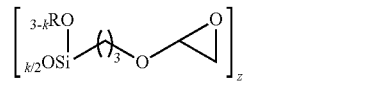
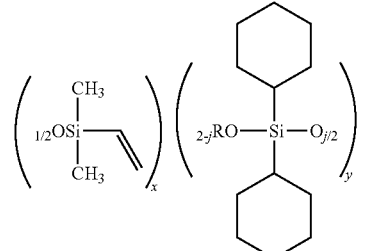
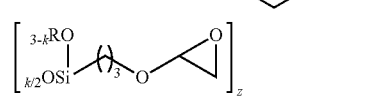
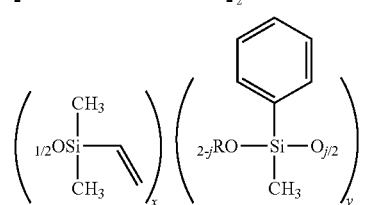
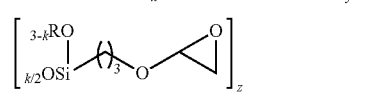
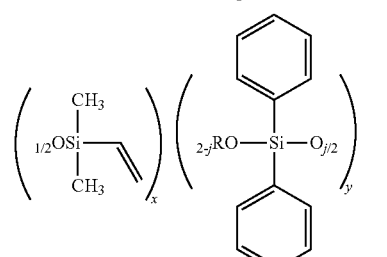
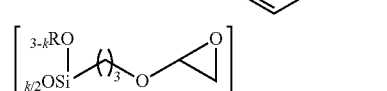
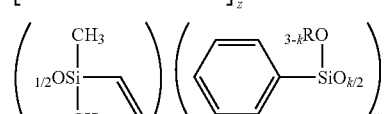
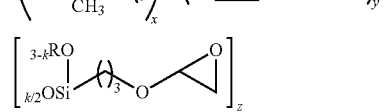
-continued
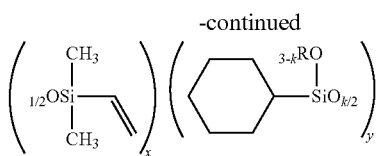
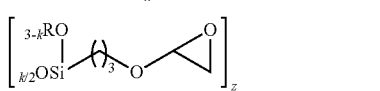
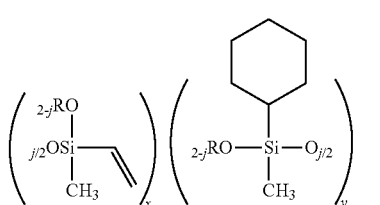
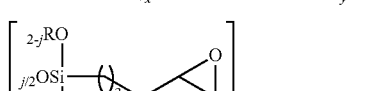
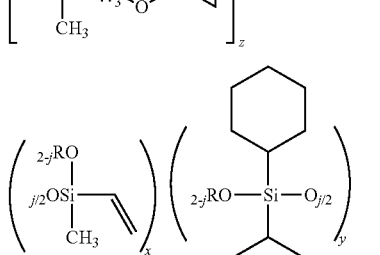
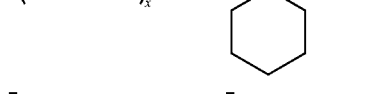
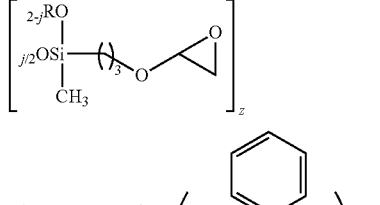
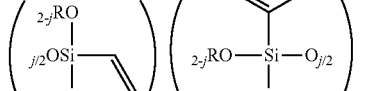
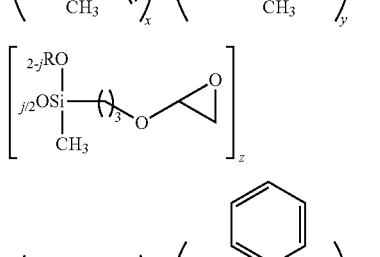
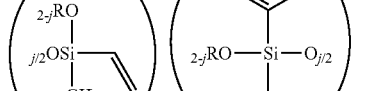
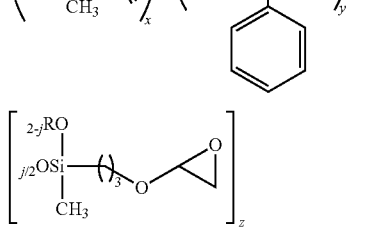

-continued

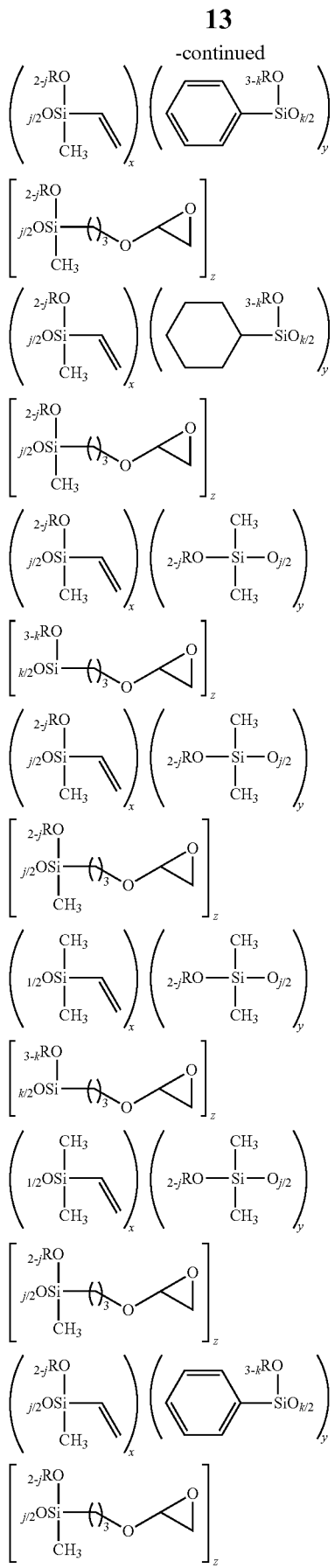

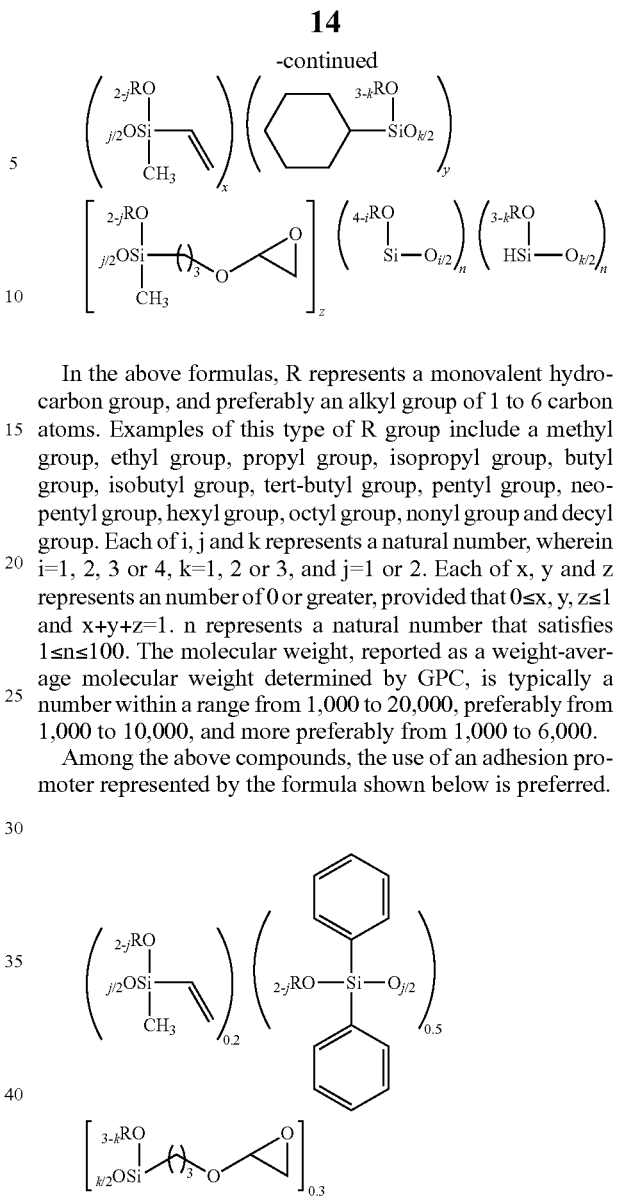

In the above formulas, R represents a monovalent hydrocarbon group, and preferably an alkyl group of 1 to 6 carbon atoms. Examples of this type of R group include a methyl group, ethyl group, propyl group, isopropyl group, butyl group, isobutyl group, tert-butyl group, pentyl group, neopentyl group, hexyl group, octyl group, nonyl group and decyl group. Each of i, j and k represents a natural number, wherein i=1, 2, 3 or 4, k=1, 2 or 3, and j=1 or 2. Each of x, y and z represents an number of 0 or greater, provided that $0 \leq x, y, z \leq 1$ and x+y+z=1. n represents a natural number that satisfies $1 \leq n \leq 100$. The molecular weight, reported as a weight-average molecular weight determined by GPC, is typically a number within a range from 1,000 to 20,000, preferably from 1,000 to 10,000, and more preferably from 1,000 to 6,000.

Among the above compounds, the use of an adhesion promoter represented by the formula shown below is preferred.

In the above formula, R, j and k are the same as defined above.

Any one of these adhesion promoters may be used alone, or a mixture of two or more adhesion promoters may be used.

The adhesion promoter is preferably added in an amount within a range from 0 to 10% by mass, and more preferably from 0 to 5% by mass, relative to the combined mass of the component (A) and the component (B), and if added, is preferably added in an amount of at least 1% by mass. If the amount of the adhesion promoter is too large, then the cured product becomes prone to cracking, and the reliability of the composition as an encapsulating material may deteriorate.

Other Additives:

An example of another additive is an inorganic filler (E). Examples of the inorganic filler include reinforcing inorganic fillers such as fumed silica and fumed titanium dioxide, and non-reinforcing inorganic fillers such as calcium carbonate, calcium silicate, titanium dioxide, ferric oxide, carbon black and zinc oxide. Other additives that may be used include light degradation inhibitors such as hindered amines, and reactive diluents such as vinyl ethers, vinyl amides, epoxy resins, oxetanes, allyl phthalates and vinyl adipate.

Further, because phenyl-containing silicones have inferior heat resistance compared with dimethyl silicones, an appropriate amount of an antioxidant may also be added to the composition.

Examples of the antioxidant include pentaerythritoltetrakis[3-(3,5-di-tert-butyl-4-hydroxyphenyl)propionate], N,N'-propane-1,3-diylbis[3-(3,5-di-tert-butyl-4-hydroxyphenyl)propionamide], thiodiethylenebis[3-(3,5-di-tert-butyl-4-hydroxyphenyl)propionate], octadecyl-3-(3,5-di-tert-butyl-4-hydroxyphenyl)propionate, 6,6'-di-tert-butyl-2,2'-thiodi-p-cresol, N,N'-hexane-1,6-diylbis[3-(3,5-di-tert-butyl-4-hydroxyphenylpropionamide)], 3,5-bis(1,1-dimethylethyl)-4-hydroxy benzenepropanoic acid, C7-C9 alkyl ester having side chain, diethyl[[3,5-bis(1,1-dimethylethyl)-4-hydroxyphenyl]methyl]phosphonate, 2,2'-ethylidenebis[4,6-di-tert-butylphenol], 3,3',3'',5,5',5''-hexa-tert-butyl-a,a',a''-(mesitylene-2,4,6-triyl)tri-p-cresol, calcium diethylbis[[[3,5-bis(1,1-dimethylethyl)-4-hydroxyphenyl]methyl]phosphonate], 4,6-bis(octylthiomethyl)-o-cresol, 4,6-bis(dodecylthiomethyl)-o-cresol, ethylenebis(oxyethylene)bis[3-(5-tert-butyl-4-hydroxy-m-tolyepropionate], hexamethylenebis[3-(3,5-di-tert-butyl-4-hydroxyphenyl)propionate], 1,3,5-tris(3,5-di-tert-butyl-4-hydroxybenzyl)-1,3,5-triazine-2,4,6-trione, 1,3,5-tris[(4-tert-butyl-3-hydroxy-2,6-xylyl)methyl]-1,3,5-triazine-2,4,6-(1H,3H,5H)-trione, 4,4'-thiodi-m-cresol, diphenylamine, reaction product of N-phenylbenzenamine and 2,4,4-trimethylpentene, 2,6-di-tert-butyl-4-(4,6-bis(octylthio)-1,3,5-triazin-2-ylamino)phenol, 3,4-dihydro-2,5,7,8-tetramethyl-2-(4,8,12-trimethyltridecyl)-2H-1-benzopyran-6-ol, 2',3-bis[[3-[3,5-di-tert-butyl-4-hydroxyphenyl]propionyl]]propionohydrazide, didodecyl 3,3'-thiodipropionate and dioctadecyl 3,3'-thiodipropionate. Preferred antioxidants include Irganox 245, 259, 295, 565, 1010, 1035, 1076, 1098, 1135, 1130, 1425WL, 1520L, 1726, 3114 and 5057 (manufactured by BASF Japan Ltd.). These antioxidants may also be used in mixtures containing two or more antioxidants.

—Method of Preparing Silicone Resin Composition—

The silicone resin composition of the present invention is prepared by stirring, dissolving, mixing and/or dispersing the above required components, either simultaneously or in separate batches, and where necessary while applying heat. Typically, in order to prevent the curing reaction from proceeding prior to use of the composition, the composition is stored as two separate liquids, with one pack containing the components (A) and (C), and the other pack containing the components (B) and (D). The two liquids are then mixed together at the time of use to effect curing. For example, if the component (C) and the component (B) and/or component (D) are stored within the same liquid, then there is a possibility of a dehydrogenation reaction occurring, and therefore the component (C) and the component (B) and/or component (D) are preferably separated during storage. Alternatively, the composition may be used as a single liquid containing a small amount of an added curing retarder such as an acetylene alcohol.

There are no particular limitations on the device used during the stirring operation, and examples of devices that may be used include a grinding machine having mixing and heating functions, a triple roll mill, a ball mill and a planetary mixer. Further, appropriate combinations of these devices may also be used. The viscosity of the obtained silicone resin composition, measured at 25° C. using a rotational viscometer, is typically within a range from 100 to 10,000,000 mPa·s, and preferably from 300 to approximately 500,000 mPa·s.

The silicone resin composition obtained in this manner may be cured immediately by heating if required, and the resulting cured product exhibits a high degree of transparency and excellent adhesion to metal substrates and package materials such as LCPs. As a result, the silicone resin composition is effective for encapsulating optical semiconductor elements. Examples of these optical semiconductor elements include LEDs, photodiodes, CCDs and CMOS and photocouplers, and the composition is particularly effective for encapsulating LEDs.

The method used for encapsulating an optical semiconductor device within a cured product of the silicone resin composition of the present invention can employ conventional methods appropriate for the type of optical semiconductor element. Although there are no particular limitations on the curing conditions for the silicone resin composition, curing is typically performed at a temperature of 40 to 250° C., and preferably 60 to 200° C., for a period of 5 minutes to 10 hours, and preferably approximately 30 minutes to 6 hours.

When a silver-plated lead frame is encapsulated, the surface of the silver-plated lead frame is preferably subjected to a preliminary surface treatment in order to increase the wettability of the silicone resin composition. From the viewpoints of workability and equipment maintenance and the like, the surface treatment is preferably a dry treatment such as an ultraviolet light treatment, an ozone treatment or a plasma treatment. A plasma treatment is particularly desirable. In order to increase the compatibility with the silicone resin composition, the material of the pre-molded package preferably has a silicone component content of at least 15% by mass of the total mass of organic components. This silicone component is defined as compounds having Si units and polymers thereof. If the silicone component content is less than 15% by mass of the total mass of organic components, then because the compatibility with the silicone resin composition deteriorates, voids (air bubbles) may occur between the silicone resin composition and the inner walls of the pre-molded package during encapsulation, resulting in an optical semiconductor device that is prone to cracking.

When formed as a sheet-like cured product having a thickness of 1 mm, the cured product of the silicone resin composition of the present invention exhibits a water vapor permeation rate that is preferably not more than 20 g/m²·day, more preferably within a range from 1 to 20 g/m²·day, and still more preferably from 5 to 18 g/m²·day. In order to achieve a water vapor permeation rate for the silicone resin composition of the present invention that satisfies the above range, the amount of alkenyl group-containing siloxane units within the alkenyl group-containing organopolysiloxane of the component (A) is preferably at least 20 mol %. The water vapor permeation rate can be measured by the Lyssy method (using an L80-5000 apparatus, manufactured by Lyssy Co., Ltd.) in accordance with JIS K 7129.

A cured product of the silicone resin composition of the present invention exhibits low gas permeability, and an optical semiconductor device encapsulated within such a cured product is resistant to discoloration of the cured product and exhibits excellent durability.

EXAMPLES

The present invention is described below in further detail based on a series of examples and comparative examples, but the present invention is in no way limited by the examples presented below.

Synthesis Example 1

Synthesis of Alkenyl Group-Containing Organopolysiloxane (A1)

A flask was charged with 408.7 g (3.00 mol) of methyltrimethoxysilane and 360.6 g of 2-propanol, and the mixture was stirred overnight at room temperature. To the resulting solution were added 754 g of xylene and 1,071 g of water, and the mixture was stirred while the internal temperature was raised to 60° C. In a separate preparation, 759.6 g (3.00 mol) of diphenyldichlorosilane, 181.0 g (1.50 mol) of vinyldimethylchlorosilane and 503 g of xylene were weighed in advance and then mixed together to prepare a chlorosilane solution, and this chlorosilane solution was then added dropwise over a period of one hour to the methyltrimethoxysilane solution that had been heated to 60° C. Following completion of the dropwise addition, the obtained reaction solution was stirred for three hours, the waste acid was separated, and the remaining organic phase was washed with water. Following azeotropic dehydration of the obtained solution, 6 g of a 50% by mass aqueous solution of KOH (0.053 mol) was added, and the resulting mixture was refluxed overnight at an internal temperature of 150° C. The resulting reaction solution was neutralized with 13.5 g (0.125 mol) of trimethylchlorosilane and 36.7 g (0.375 mol) of potassium acetate, and following filtering, the solvent was removed from the filtrate by distillation under reduced pressure. The residue was then washed with methanol, and the solvent was once again removed by distillation. In this manner, a siloxane resin (resin 1) having an average composition formula shown below was synthesized. The polystyrene-equivalent weight-average molecular weight of the thus obtained siloxane resin measured by GPC was 1,500, and the vinyl group content was 0.119 mol/100 g.

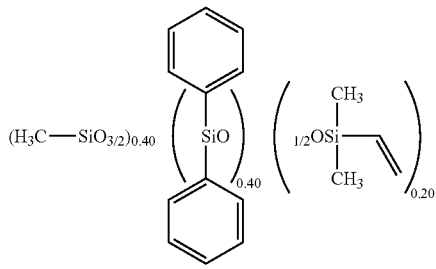

Synthesis Example 2

Synthesis of Alkenyl Group-Containing Organopolysiloxane (A1)

A flask was charged with 544.9 g (4.00 mol) of methyltrimethoxysilane and 484.8 g of 2-propanol, and the mixture was stirred overnight at room temperature. To the resulting solution were added 548 g of xylene and 1,270 g of water, and the mixture was stirred while the internal temperature was raised to 60° C. In a separate preparation, 977.4 g (4.00 mol) of diphenyldichlorosilane, 107.2 g (0.89 mol) of vinyldimethylchlorosilane and 1,000 g of xylene were weighed in advance and then mixed together to prepare a chlorosilane solution, and this chlorosilane solution was then added dropwise over a period of one hour to the methyltrimethoxysilane solution that had been heated to 60° C. Following completion of the dropwise addition, the obtained reaction solution was stirred for three hours, the waste acid was separated, and the remaining organic phase was washed with water. Following azeotropic dehydration of the obtained solution, 7.1 g of a 50% by mass aqueous solution of KOH (0.063 mol) was added, and the resulting mixture was refluxed overnight at an internal temperature of 150° C. The resulting reaction solution was neutralized with 14.5 g (0.134 mol) of trimethylchlorosilane and 43.6 g (0.445 mol) of potassium acetate, and following filtering, the solvent was removed from the filtrate by distillation under reduced pressure. The residue was then washed with methanol, and the solvent was once again removed by distillation. A siloxane resin (resin 2) having an average composition formula shown below was synthesized. The polystyrene-equivalent weight-average molecular weight of the thus obtained siloxane resin measured by GPC was 1,800, and the vinyl group content was 0.096 mol/100 g.

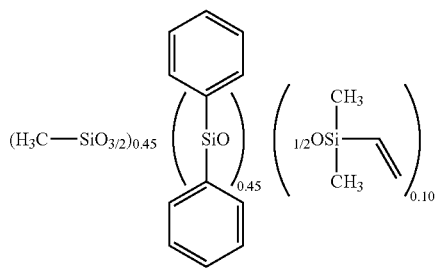

Synthesis Example 3

Synthesis of Organohydrogenpolysiloxane (B)

A flask was charged with 5,376 g (22.0 mol) of diphenyldimethoxysilane and 151.8 g of acetonitrile, the resulting mixture was cooled to 10° C. or lower, and the dropwise reactions described below were performed at an internal temperature of 10° C. or lower.

Namely, 303.69 g of concentrated sulfuric acid was added dropwise to the cooled mixture, 940.36 g of water was subsequently added dropwise over a period of one hour, and 2,216 g (16.5 mol) of $(HSiMe_2)_2O$ was then added dropwise to the flask. The thus obtained mixture was then stirred overnight. Subsequently, the waste acid was separated from the reaction mixture, and following washing with water, the solvent was removed by distillation under reduced pressure, yielding an organohydrogenpolysiloxane 1 of the structure shown below. The SiH group content was 0.403 mol/100 g.

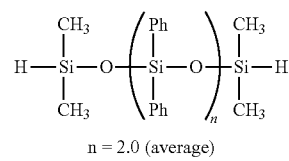

n = 2.0 (average)

Synthesis Example 4

Synthesis of Comparative Alkenyl Group-Containing Organopolysiloxane

A flask was charged with 1,050 g of xylene and 5,143 g of water, and a mixture containing 2,222 g (10.5 mol) of phenyltrichlorosilane, 543 g (4.50 mol) of vinyldimethylchlorosilane and 1,575 g of xylene was then added dropwise to the flask. Following completion of the dropwise addition, the resulting mixture was stirred for three hours, the waste acid was separated, and the remaining mixture was washed with water. Following subsequent azeotropic dehydration, 6 g (0.15 mol) of KOH was added to the flask, and the resulting mixture was refluxed overnight under heating at 150° C. The resulting reaction mixture was neutralized with 27 g (0.25 mol) of trimethylchlorosilane and 24.5 g (0.25 mol) of potassium acetate, and following filtering, the solvent was removed from the filtrate by distillation under reduced pressure, completing synthesis of a siloxane resin (resin 3) having an average composition formula shown below. The vinyl group content was 0.195 mol/100 g.

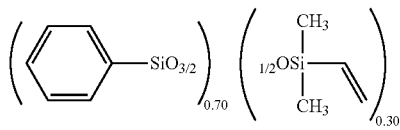

Synthesis Example 5

Synthesis of Adhesion Promoter

A flask was charged with 264.46 g (2.00 mol) of vinylmethyldimethoxysilane, 733.08 g (3.00 mol) of diphenyldimethoxysilane, 1,181.5 g (5.00 mol) of 3-glycidoxypropyltrimethoxysilane and 2,700 ml of IPA, 82.00 g of a 25% by mass aqueous solution of tetramethylammonium hydroxide and 740 g of water were then mixed together and added to the flask, and the resulting mixture was stirred for three hours. Toluene was then added, and the resulting mixture was neutralized with an aqueous solution of sodium dihydrogen phosphate, and then washed with water. The solvent was then removed by distillation under reduced pressure, completing synthesis of an adhesion promoter 1 shown below. The vinyl group content was 0.098 mol/100 g.

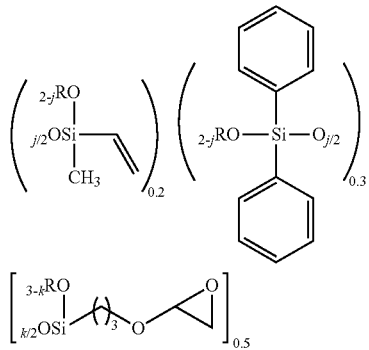

The adhesion promoter is a mixture of compounds of the above formula in which k=1, 2 or 3, j=1 or 2, and R represents a hydrogen atom, a methyl group or an isopropyl group.

Examples 1 to 3

In each example, the components prepared in synthesis examples 1 to 5 and the components listed below were mixed together in the amounts shown in Table 1, thus preparing a series of silicone resin compositions.
Linear organopolysiloxane with both molecular chain terminals blocked with vinyl groups:
A phenylmethylpolysiloxane with both molecular chain terminals blocked with vinyldimethylsiloxy groups, represented by a formula shown below.

Phenyl content: 30% by mass, vinyl group content: 0.0185 mol/100 g.

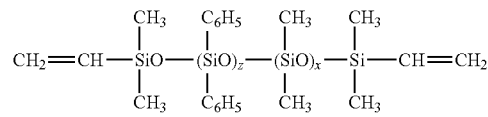

In the formula, x represents 30 (average value) and z represents 68 (average value).

Organohydrogenpolysiloxane 2: a phenyl group-containing branched organohydrogenpolysiloxane represented by a formula shown below.

Amount of produced hydrogen gas: 170.24 ml/g (0.760 mol/100 g).

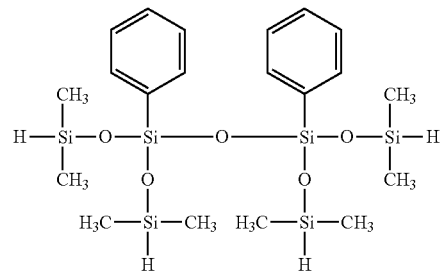 [SMILES: C[SiH](C)O[Si](O[SiH](C)C)(O[Si](O[SiH](C)C)(O[SiH](C)C)c1ccccc1)c1ccccc1]

Organohydrogenpolysiloxane 3: a phenyl group-containing branched organohydrogenpolysiloxane represented by a formula shown below.

Amount of produced hydrogen gas: 167.99 ml/g (0.750 mol/100 g).

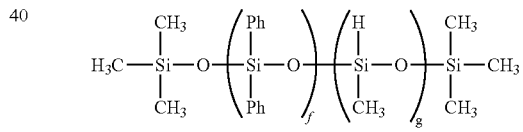

In the formula, f and g represent average values, wherein 10<f+g<300.

Addition reaction catalyst: an octyl alcohol-modified solution of chloroplatinic acid (platinum concentration: 2% by mass).

Comparative Example 1

The resin 3 synthesized in synthesis example 4 and the components listed above were mixed in the amounts shown in Table 1 to prepare a silicone resin composition.
[Evaluation of Properties]
Preparation of Test Materials:

Each of the silicone resin compositions of examples 1 to 3 and comparative example 1 was molded under heat at 150° C. for 4 hours to form a sheet-like cured product having dimensions of length×width×thickness=110 mm×120 mm×2 mm. The test materials obtained in this manner were used to evaluate the properties described below.

External Appearance:

The external appearance of each test material was evaluated visually.

Mechanical Properties:

For each test material, the tensile strength, the hardness (measured using a type A spring tester) and the elongation at break were measured in accordance with JIS K6301.

Moisture Permeation Rate:

The moisture permeation rate was measured by the Lyssy method (using an L80-5000 apparatus, manufactured by Lyssy Co., Ltd.) in accordance with JIS K 7129.

[Preparation of LED Devices]

Using each of the silicone resin compositions prepared in examples 1 to 3 and comparative example 1, a series of optical semiconductor devices encapsulated within cured products of the silicone resin compositions were prepared in the manner described below.

A cup-shaped premolded package for an LED (3 mm×3 mm×1 mm, diameter of opening: 2.6 mm) having a copper lead frame plated with silver of thickness 2 μm provided on the bottom surface of the package was treated with an Ar plasma (output: 100 W, irradiation time: 10 seconds) under reduced pressure conditions. An electrode of an InGaN blue light emitting diode element was connected to the bottom surface lead frame using a silver paste (conductive adhesive), and the counter electrode of the light emitting element was connected to the counter lead frame using a gold wire. The addition-curable silicone resin composition of example 1, 2, 3 or comparative example 1 was injected into the opening of the package, and then cured by heating at 60° C. for one hour and then at 150° C. for a further 4 hours, thereby encapsulating the light emitting element and completing preparation of an LED device.

The LED devices of examples 1 to 3 and comparative example 1 prepared in this manner were then subjected to evaluation of the properties described below.

[Evaluation of Properties]

Reliability Test:

The LED device was lit by passing a current of 25 mA through the device, and after standing in a lit state for 1,000 hours at Tj (junction temperature)=150° C., the degree of discoloration in the vicinity of the silver-plated surface inside the package was evaluated visually.

Temperature Cycling Test:

Five of the prepared LED devices were subjected to 1,000 repetitions of a temperature cycle, wherein each cycle consisted of holding the devices at −40° C. for 10 minutes, and then holding the devices at 100° C. for 10 minutes. The devices were then inspected visually for the state of adhesion at the interface between the cured product of the silicone resin composition and the package (if any peeling was observed, the device was evaluated as having an adhesion fault), and the existence of any cracks within the cured product. Devices having an adhesion fault and/or noticeable cracking were evaluated as defective, and the number of devices evaluated as defective was recorded in Table 1. Further, the cured product was also evaluated visually for discoloration. The results are shown in Table 1.

High-Temperature, High-Humidity Lighting Test:

Five of the prepared LED devices were lit continuously for 1,000 hours under conditions of 60° C. and 90 RH %. Subsequently, the devices were evaluated for defects by evaluating the state of adhesion and the existence of cracks in the same manner as that described for the temperature cycling test, and the number of devices evaluated as defective was recorded in Table 1. Further, discoloration of the cured product was also evaluated in the same manner as described above. The results are shown in Table 1.

TABLE 1

| Composition | | Example 1 | Example 2 | Example 3 | Comparative example 1 |
|---|---|---|---|---|---|
| Si-H/Si-Vi ratio | | 1.10 | 1.10 | 1.10 | 1.10 |
| Resin 1 | parts by mass | 100 | | 100 | |
| Resin 2 | parts by mass | | 100 | | |
| Resin 3 | parts by mass | | | | 100 |
| Phenylmethylpolysiloxane with both molecular chain terminals blocked with vinyldimethylsiloxy groups | parts by mass | 15 | 30 | 15 | 30 |
| Organohydrogenpolysiloxane 1 | parts by mass | 15.2 | 9.7 | 16.6 | 16.7 |
| Organohydrogenpolysiloxane 2 | parts by mass | | | 5.1 | |
| Organohydrogenpolysiloxane 3 | parts by mass | 12.0 | 9.8 | | 5.1 |
| Addition reaction catalyst | parts by mass | 0.02 | 0.02 | 0.02 | 0.02 |
| Adhesion promoter 1 | parts by mass | 3 | 3 | 3 | 3 |

| Evaluation results | | | | | |
|---|---|---|---|---|---|
| External appearance following curing | | colorless and transparent | colorless and transparent | colorless and transparent | white and semi-transparent |
| Hardness | Type A | 90 | 85 | 88 | 80 |
| Tensile strength | MPa | 3.6 | 3.3 | 2.8 | 1.5 |
| Elongation at break | % | 55 | 70 | 20 | 120 |
| Moisture permeation rate | g/m$^2$ · day | 11 | 10 | 14 | 27 |
| Reliability test (Tj = 150° C./1000 hr) External appearance | Discoloration or degradation | colorless and transparent | colorless and transparent | colorless and transparent | discoloration to faint yellow, but transparent |
| Temperature cycling test (−40° C. and 100° C./1000 cycles) Defect rate, external appearance | Number of defects/5 Discoloration | 0/5 no discoloration | 0/5 no discoloration | 0/5 no discoloration | 3/5 (cracking) no discoloration |
| High-temperature, high-humidity lighting test (60° C./90 RH %/1000 hr) Defect rate, external appearance | Number of defects/5 Discoloration | 0/5 no discoloration | 0/5 no discoloration | 0/5 no discoloration | 3/5 (cracking) no discoloration |

As shown in Table 1, the cured product of the silicone resin composition of the present invention exhibited low moisture permeability and suffered no discoloration of the resin even after the lighting test. Further, even in the reliability test, no cracking or peeling was observed.

The silicone resin composition of the present invention can provide an optical semiconductor device which, compared with a device that uses a typical phenyl-containing silicone, exhibits superior levels of heat resistance and light resistance, and excellent resistance to gas permeation, and therefore the composition of the present invention can be used favorably for encapsulating optical semiconductor elements.

What is claimed is:

1. A curable silicone resin composition comprising:
   (A) an alkenyl group-containing organopolysiloxane, comprising an organopolysiloxane
   (A1) represented by an average composition formula (1) shown below and containing at least two alkenyl groups per molecule:

$$(R^1SiO_{3/2})_a(R^2_2SiO)_b(R^3R^4_2SiO_{1/2})_c \quad (1)$$

wherein
   $R^1$ represents an alkyl group of 1 to 10 carbon atoms,
   $R^2$ represents an aryl group of 6 to 14 carbon atoms,
   $R^3$ represents an alkenyl group of 2 to 8 carbon atoms,
   each $R^4$ independently represents an alkyl group of 1 to 10 carbon atoms or an aryl group of 6 to 14 carbon atoms,
   a represents a number of 0.2 to 0.6, b represents a number of 0.2 to 0.6, and c represents a number of 0.05 to 0.5, provided that a+b+c=1.0,
   (B) an organohydrogenpolysiloxane represented by an average composition formula (2) shown below and containing at least two silicon atom-bonded hydrogen atoms per molecule: in an amount that yields a molar ratio of silicon atom-bonded hydrogen atoms within the component (B) relative to alkenyl groups bonded to silicon atoms that exist within the composition of 0.4 to 4.0:

$$R^1_dR^2_eH_fSiO_{(4-d-e-f)/2} \quad (2)$$

wherein $R^1$ and $R^2$ are as defined above, d represents a number of 0.6 to 1.5, e represents a number of 0 to 0.5, and f represents a number of 0.4 to 1.0, provided that d+e+f=1.0 to 2.5, and
   (C) a catalytically effective amount of an addition reaction catalyst.

2. The silicone resin composition according to claim 1, wherein the alkenyl group-containing organopolysiloxane of the component (A) further comprises (A2) an organopolysiloxane having a linear structure in which a main chain is composed of repeating diorganosiloxane units and both molecular chain terminals are blocked with triorganosiloxy groups, and an amount of the component (A2) is within a range from 0.01 to 50 parts by mass per 100 parts by mass of the component (A1).

3. The silicone resin composition according to claim 2, wherein the organopolysiloxane having a linear structure of the component (A2) is an organopolysiloxane represented by a formula (3) shown below:

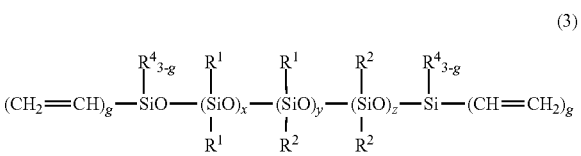

(3)

wherein $R^1$, $R^2$ and $R^4$ are as defined above, g represents an integer of 1, 2 or 3, and each of x, y and z represents 0 or a positive integer, provided that $1 \leq x+y+z \leq 1,000$, and at least one of x and y is an integer of 1 or greater.

4. The silicone resin composition according to claim 1, further comprising (D) an adhesion promoter.

5. The silicone resin composition according to claim 1, further comprising (E) an inorganic filler.

6. The silicone resin composition according to claim 4, further comprising (E) an inorganic filler.

7. The silicone resin composition according to claim 1, wherein a cured product of the composition having a thickness of 1 mm has a water vapor permeation rate, measured by the Lyssy method in accordance with JIS K 7129, of not more than 20 g/m²·day.

8. The silicone resin composition according to claim 1, which is used as a material for encapsulating an optical semiconductor element.

9. An optical semiconductor device having an encapsulated optical semiconductor element, the device comprising an optical semiconductor element, and a cured product of the silicone resin composition defined in claim 1 that encapsulates an active region of the element.

* * * * *